(12) United States Patent
Marbella et al.

(10) Patent No.: US 11,152,321 B2
(45) Date of Patent: Oct. 19, 2021

(54) SEMICONDUCTOR DEVICE HAVING A COPPER PILLAR INTERCONNECT STRUCTURE

(71) Applicant: Infineon Technologies AG, Neubiberg (DE)

(72) Inventors: Carlo Marbella, Singapore (SG); Swee Guan Chan, Melaka (MY); Eung San Cho, Torrance, CA (US); Navas Khan Oratti Kalandar, Singapore (SG)

(73) Assignees: Infineon Technologies AG, Neubiberg (DE); Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 16/784,751

(22) Filed: Feb. 7, 2020

(65) Prior Publication Data
US 2020/0258855 A1 Aug. 13, 2020

(30) Foreign Application Priority Data
Feb. 11, 2019 (DE) .......................... 102019103355.1

(51) Int. Cl.
*H01L 23/00* (2006.01)
*H01L 21/027* (2006.01)
(52) U.S. Cl.
CPC .......... *H01L 24/11* (2013.01); *H01L 21/0273* (2013.01); *H01L 24/13* (2013.01); *H01L 2224/13083* (2013.01); *H01L 2224/13147* (2013.01)

(58) Field of Classification Search
CPC ..... H01L 24/11; H01L 21/0273; H01L 24/13; H01L 2224/13083; H01L 2224/13147
See application file for complete search history.

(56) References Cited

U.S. PATENT DOCUMENTS

| | | | |
|---|---|---|---|
| 8,653,659 B2 * | 2/2014 | Chang | H01L 24/13 257/737 |
| 2008/0067677 A1 | 3/2008 | Lin et al. | |
| 2008/0111236 A1 | 5/2008 | Lee et al. | |
| 2009/0261473 A1 | 10/2009 | Lee et al. | |
| 2011/0298123 A1 | 12/2011 | Hwang et al. | |
| 2014/0038405 A1 | 2/2014 | Yu et al. | |
| 2014/0077359 A1 | 3/2014 | Tsai et al. | |
| 2014/0131858 A1 * | 5/2014 | Pan | H01L 24/19 257/737 |
| 2015/0340332 A1 | 11/2015 | Rinne et al. | |
| 2016/0322321 A1 * | 11/2016 | Yajima | H01L 24/11 |
| 2017/0084561 A1 | 3/2017 | Seo et al. | |
| 2019/0164923 A1 | 5/2019 | Ishii | |
| 2020/0251432 A1 * | 8/2020 | Lin | H01L 24/20 |

* cited by examiner

*Primary Examiner* — Douglas W Owens
(74) *Attorney, Agent, or Firm* — Murphy, Bilak & Homiller, PLLC (57) ABSTRACT

A method of manufacturing a semiconductor device is described. The method includes depositing a photoresist layer over a semiconductor substrate. The photoresist layer is patterned to form an opening in the photoresist layer. A copper pillar is formed in the opening. A diffusion barrier layer is formed over the copper pillar and over a photoresist portion of the photoresist layer directly adjoining the opening. A solder structure is deposited over the diffusion barrier layer.

17 Claims, 8 Drawing Sheets

SEMICONDUCTOR DEVICE HAVING A COPPER PILLAR INTERCONNECT STRUCTURE

TECHNICAL FIELD

The disclosure relates to the field of manufacturing semiconductor devices, and in particular to manufacturing a copper pillar interconnect structure on a semiconductor substrate.

BACKGROUND

Several technologies are available for electrically connecting a semiconductor substrate to electrical circuitry. A known technique utilizes copper pillars to serve as an electrical interconnect between the semiconductor substrate and a package internal or package external electrical redistribution media. This technique may be used in flip-chip bonding, where the semiconductor substrate (e.g. chip) is electrically bonded face-down to the electrical redistribution media via so-called bumps, where each bump includes a copper pillar.

Temperature cycling represents a major challenge for copper pillar interconnect structures. Hence, many of the present semiconductor devices using copper pillar interconnect structures are restricted to in-house applications or environments with limited temperature variations.

SUMMARY

According to a first aspect, a method of manufacturing a semiconductor device comprises depositing a photoresist layer over a semiconductor substrate. The photoresist layer is patterned to form an opening in the photoresist layer. A copper pillar is formed in the opening. A diffusion barrier layer is formed over the copper pillar and over a photoresist portion of the photoresist layer directly adjoining the opening. A solder structure is deposited over the diffusion barrier layer.

According to a second aspect, a method of manufacturing a semiconductor device comprises depositing a first photoresist layer over a semiconductor substrate. The first photoresist layer is patterned to form an opening in the first photoresist layer. A copper pillar is formed in the opening. A second photoresist layer is deposited over the semiconductor substrate. The second photoresist layer is patterned to form an overhang opening in the second photoresist layer, the overhang opening being aligned with the opening and having a width which is greater than a width of the opening. A diffusion barrier layer is formed over the copper pillar and in the overhang opening. A solder structure is deposited over the diffusion barrier layer.

A semiconductor device comprises a semiconductor substrate and a copper pillar disposed at the semiconductor substrate. A solder structure is disposed atop of the copper pillar. A diffusion barrier layer is arranged between the copper pillar and the solder structure. The diffusion barrier layer overhangs the copper pillar and comprises a stepped sidewall.

DETAILED DESCRIPTION

It is to be understood that the features of the various exemplary embodiments and examples described herein may be combined with each other, unless specifically noted otherwise.

As used in this specification, the terms "bonded" or "deposited" or "applied" or "coated" are not meant to mean that the elements or layers must directly be contacted together; intervening elements or layers may be provided between the "bonded" or "deposited" or "applied" or "coated" elements, respectively. However, in accordance with the disclosure, the above-mentioned terms may, optionally, also have the specific meaning that the elements or layers are directly contacted together, i.e. that no intervening elements or layers are provided between the "bonded" or "deposited" or "applied" or "coated" elements, respectively.

The word "over" used with regard to a part, element or material layer formed or located "over" a surface may be used herein to mean that the part, element or material layer be located (e.g. placed, formed, deposited, applied etc.) "indirectly on" the implied surface with one or more additional parts, elements or layers being arranged between the implied surface and the part, element or material layer. However, in accordance with the disclosure, the word "over" used with regard to a part, element or material layer formed or located "over" a surface may be used herein to specifically mean that the part, element or material layer be located (e.g. placed, formed, deposited, applied etc.) "directly on", e.g. in direct contact with, the implied surface.

Figure 1A:
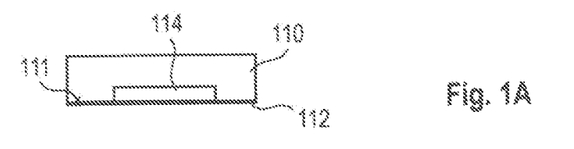
FIGS. 1A-1H are sectional views illustrating stages of an exemplary method of manufacturing a semiconductor device according to a first aspect of the disclosure.

Referring to FIG. 1A, a surface 111 of a semiconductor substrate 110 may be coated by a seed layer 112. The seed layer 112 may have been deposited over the surface 111 of the semiconductor substrate 110 by sputtering or any other appropriate technology.

The semiconductor substrate 110 may, e.g., be a wafer or a chip. The semiconductor substrate 110 may be front-end processed, i.e. transistors and/or capacitors, etc. and an internal metal interconnect may be provided in the semiconductor substrate 110. Further, FIG. 1A exemplarily illustrates an optional die pad 114 exposed at the surface 111 of the semiconductor substrate 110. The die pad 114 may connect to substrate internal circuitry. In other words, the semiconductor substrate 110 may represent an integrated circuit (IC) or a wafer containing ICs.

The semiconductor substrate 110 may comprise or be made of any semiconductor material, e.g. Si, SiC, SiGe, GaAs, GaN, etc. The (optional) die pad 114 may consist of any electrically conducting material, e.g. Al, Cu, Au, Ag, etc.

Figure 1B:
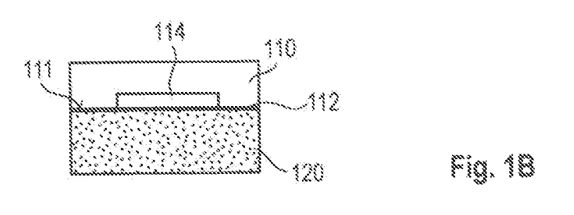

FIG. 1B illustrates depositing a photoresist layer 120 over the seed layer 112. The photoresist layer 120 may be applied to a thickness of e.g. between 20 and 200 µm. In particular, the thickness of the photoresist layer 120 may, e.g., be equal to or less than or greater than 40, 80, 120, or 160 µm.

The photoresist layer 120 may, e.g., be applied by a spinning process and may completely cover the seed layer 112 and/or the surface 111 of the semiconductor substrate 110.

Figure 1C:
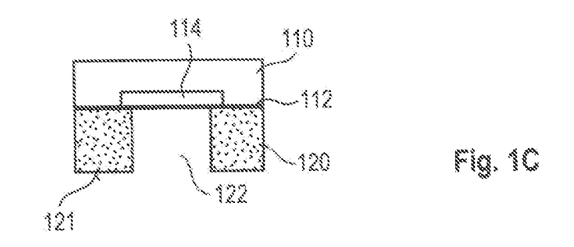

Referring to FIG. 1C, the photoresist layer 120 is patterned to form an opening 122 in the photoresist layer 120. Patterning may be accomplished by projecting light through a photomask (not shown) onto the photoresist layer 120 to expose the photoresist, developing the photoresist, washing-off e.g. the undeveloped photoresist, and etching to clean out the areas where the photoresist has been washed away. The photoresist may either be a positive or negative photoresist, i.e. the exposed photoresist may be soluble to be washed away or insoluble to form the photoresist pattern.

Figure 1D:
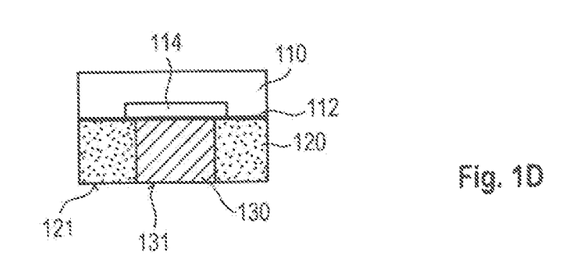

Referring to FIG. 1D, a copper pillar 130 is formed in the opening 122. The pillar metal is copper, possibly including intended impurities such as, e.g., sulphur or other non-metal or metal elements.

The copper metal of the copper pillar 130 may be deposited by electroplating. The patterned photoresist layer 120 serves as a plating mask.

In FIG. 1D, the copper pillar 130 is formed to completely fill the opening 122, i.e. a top surface 131 of the copper pillar 130 is approximately at the same level as a top surface 121 of the patterned photoresist layer 120. However, as will be explained in more detail further below, the copper pillar 130 may also be plated to a height less than the thickness of the photoresist layer 120.

Figure 1E:
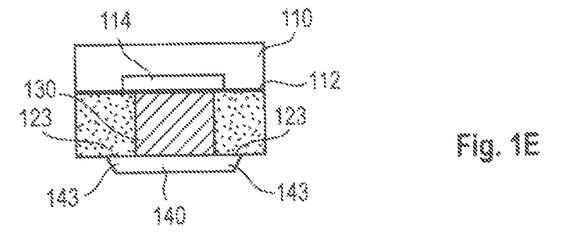

FIG. 1E illustrates forming a diffusion barrier layer 140 over the copper pillar 130. The diffusion barrier layer 140 may, e.g., be formed by electroplating. The diffusion barrier layer 140 may comprise or be of nickel (Ni). The diffusion barrier layer 140 may be deposited to a thickness of between 2 and 10 µm, e.g. to a thickness equal to or less than or greater than 3 µm, 4 µm, 5 µm, 6 µm, 7 µm, 8 µm, 9 µm. Preferably, the thickness of the diffusion barrier layer 140 is equal to or greater than 3 µm or 4 µm.

As illustrated in FIG. 1E, the diffusion barrier layer 140 completely covers the top surface 131 of the copper pillar 130 and further extends over a portion 123 of the photoresist layer 120 which directly adjoins the opening 122.

The diffusion barrier layer 140 may be fabricated by mushroom plating. Mushroom plating is an electroplating or electroless plating process in which the layer also grows in the lateral direction on the photoresist layer 120.

Lateral growth of the diffusion barrier layer 140 provides for an overhang 143 of the diffusion barrier layer 140. The overhang 143 of the diffusion barrier layer 140 overlaps the portion 123 of the photoresist layer 120 which is covered by the diffusion barrier layer 140. The overhang 143 may be shaped as a circumferential brim of the diffusion barrier layer 140.

Growth in the lateral direction may occur at the same rate as growth in the vertical direction, i.e. the lateral dimension of the overhang 143 (i.e. the part of the diffusion barrier layer 140 which overlies (overlaps) the portion 123 of the photoresist layer 120) may, e.g., be approximately equal to the thickness of the diffusion barrier layer 140.

Figure 1F:
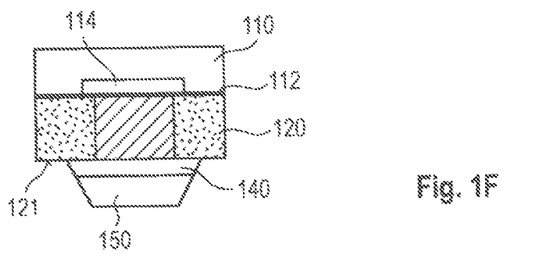

FIG. 1F illustrates depositing a solder structure 150 over the diffusion barrier layer 140. The solder structure 150 may be of any appropriate solder material, e.g. SnAg. The solder structure 150 may be applied by electroplating or any other suitable solder deposition process.

The solder structure 150 may, e.g., also be applied by mushroom plating. In this case, a solder brim (not shown) would form and cover the side flanges of the diffusion barrier layer 140 and could also reach out to a certain extent over the top surface 121 of the patterned photoresist layer 120.

Figure 1G:
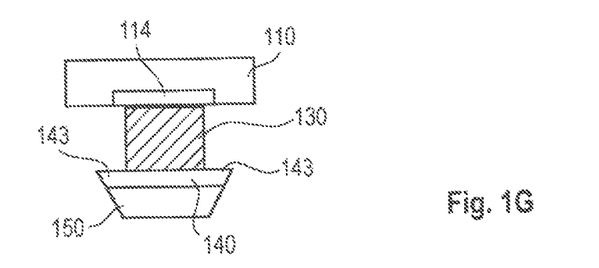

Referring to FIG. 1G, the photoresist layer 120 and (optionally) the seed layer 112 are removed (stripped). Removal of the photoresist layer 120 and the seed layer 112 may, e.g., be accomplished by etching.

Figure 1H:
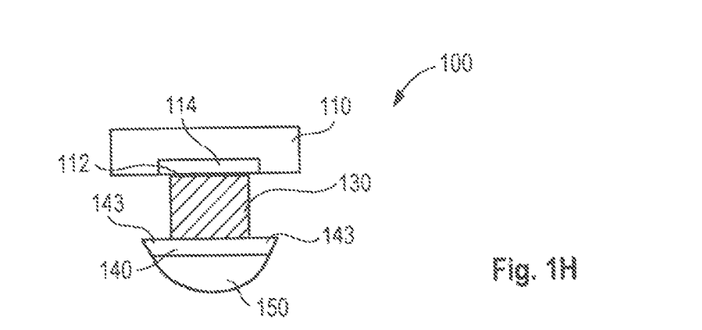

An optional solder reflow process may then result in a semiconductor device 100 having a copper pillar interconnect structure as shown in FIG. 1H. Typically, the semiconductor device 100 will be provided with a high number of such copper pillar interconnect structures, which may serve as an I/O interface between the semiconductor device 100 and a package internal or package external electrical redistribution media such as, e.g., a PCB (printed circuit board), an interposer, or any other kind of chip carrier.

The diffusion barrier layer 140 prevents direct contact of the solder structure 150 and the copper pillar 130 as well as their diffusion during high temperature processes such as, e.g., solder reflow or during operation of the semiconductor device 100. Moreover, the overhang 143 of the diffusion barrier layer 140 increases the separation between the solder structure 150 and the sidewalls of copper pillar 130. That way, the overhang 143 of the diffusion barrier layer 140 is effective as a sidewall protection of the copper pillar 130 against wetting, migration or contamination of the copper pillar sidewalls by solder material.

This sidewall protection effectively prevents the creation of intermetallic compounds (IMCs) and voids in the copper at high temperatures over time. As a result, the semiconductor device 100 will be less prone to degradation over time than semiconductor devices equipped with conventional copper pillar interconnect structures. Hence, the semiconductor device 100 may be used in critical temperature cycling applications such as, e.g., in the automotive industry where temperature swings ranging from about −40° C. to +150° C. may occur.

Figure 2A:
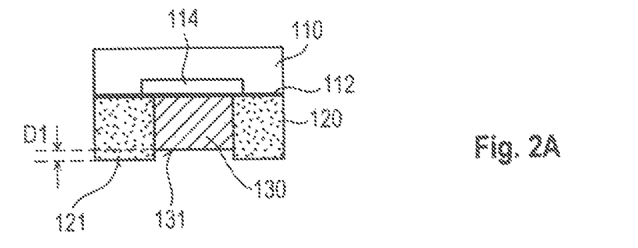
FIGS. 2A-2D are sectional views illustrating stages of an exemplary method of manufacturing a semiconductor device according to the first aspect of the disclosure, wherein a diffusion barrier layer atop a copper pillar has a stepped sidewall.
Figure 2B:
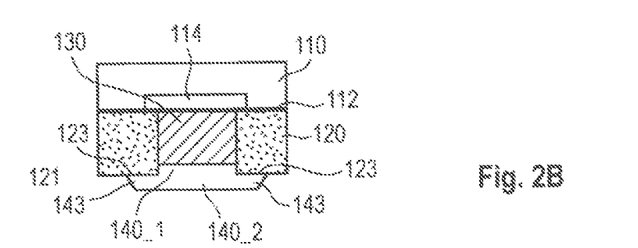
Figure 2C:
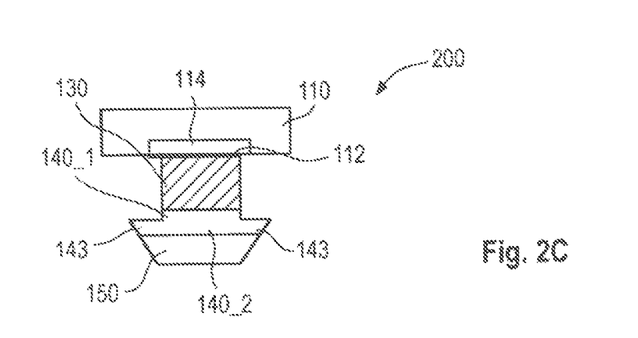
Figure 2D:
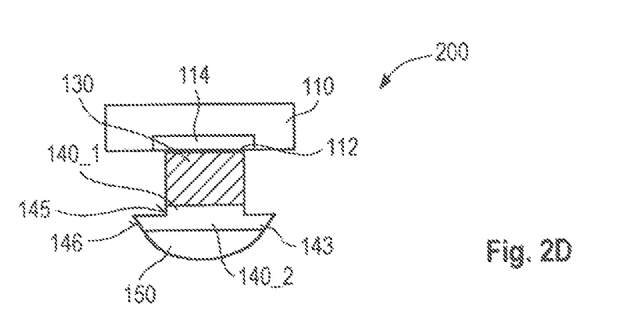

FIGS. 2A-2D illustrate stages of an exemplary method of manufacturing a semiconductor device 200 as shown in FIG. 2D. The exemplary process may start with the manufacturing stages of FIGS. 1A-1C, and reference is made to the above description in order to avoid reiteration.

FIG. 2A shows a manufacturing stage which is identical to the manufacturing stage of FIG. 1D except that the copper pillar 130 is plated only to a height less than the thickness of the photoresist layer 120. Differently put, the level of the top surface 131 of the copper pillar 130 is spaced apart from the level of the top surface 121 of the photoresist layer 120 by a distance D1.

FIG. 2B illustrates the formation of the diffusion barrier layer 140 over the copper pillar 130 and over the photoresist portion 123 of the photoresist layer 120 directly adjoining the opening 122. The process includes plating a base portion 140_1 (of thickness D1) of the diffusion barrier layer 140 in the opening 122 and plating an overhang portion 140_2 of the diffusion barrier layer 140 over the base portion 140_1 and over the photoresist portion 123 of the photoresist layer 120. The overhang portion 140_2 includes the circumferential overhang 143 covering the portion 123 of the photoresist layer 120.

A plane (not shown) defined by top surface 121 of the photoresist layer 120 may serve as an imaginary dividing plane between the base portion 140_1 and the overhang portion 140_2 of the diffusion barrier layer 140. The base portion 140_1 may directly adjoin the top surface 131 of the copper pillar 130. The overhang portion 140_2 may directly adjoin the solder structure 150. Moreover, reference is made to the description of FIG. 1E to avoid reiteration.

The thickness D1 of the base portion 140_1 of the diffusion barrier layer 140 may be equal to or less than or greater than 1 µm, 2 µm, 3 µm, 4 µm, 5 µm, 6 µm, 7 µm, 8 µm, 9 µm. The thickness of the diffusion barrier layer 140 of FIG. 2B may, e.g., be equal to the thickness of the diffusion barrier layer 140 of FIG. 1E. As an example, the thickness D1 of the base portion 140_1 of the diffusion barrier layer 140 may be about half of the thickness of the diffusion barrier layer 140 or may be within a range of 40-60% or 30-70% of the thickness of the diffusion barrier layer 140.

The overhang portion 140_2 of the diffusion barrier layer 140 may have a thickness within the same range as D1. Further, as explained in conjunction with FIG. 1E, the lateral dimension of the overhang 143 may, e.g., be about equal to the thickness of the overhang portion 140_2.

FIGS. 2C and 2D illustrate stages of a manufacturing process for fabricating a semiconductor device 200 which are similar to the stages shown in FIGS. 1G and 1H, respectively, and reference is made to the above description in order to avoid reiteration. Specifically, as can be seen in FIG. 2D, the diffusion barrier layer 140 may comprise a first sidewall portion 145 of the base portion 140_1 of the diffusion barrier layer 140 and a second sidewall portion 146 of the overhang portion 140_2 of the diffusion barrier layer 140. The base portion 140_1 has a first width and the overhang portion 140_2 has a second width, wherein the second width is greater than the first width as explained above. For example, the first sidewall portion 145 and the second sidewall portion 146 may have the shape of a step to provide for the difference in width. Further, the second sidewall portion 146 may taper towards the solder structure 150.

The semiconductor devices 200 of FIGS. 2C and 2D which have a stepped barrier layer 140 may also be fabricated by other manufacturing methods than the exemplary method illustrated in FIGS. 2A-2D.

FIGS. 3A-3E illustrate stages of a manufacturing process according to a second aspect of the disclosure. This manufacturing process may start with the stages shown in FIGS. 1A-1D, and reference is made to the above description in order to avoid reiteration.

Figure 3A:
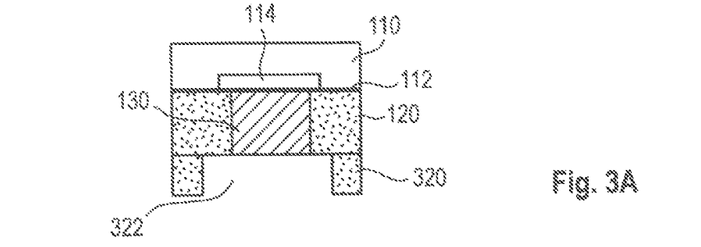
FIGS. 3A-3E are sectional views illustrating stages of an exemplary method of manufacturing a semiconductor device according to a second aspect of the disclosure.

In FIG. 3A a second photoresist layer 320 has been added atop the (first) photoresist layer 120. The second photoresist layer 320 may have a thickness which is equal to or less than the thickness the photoresist layer 120. The second photoresist layer 320 may be applied (e.g. by a spinning process) to completely cover the first photoresist layer 120 and the copper pillar 130.

Further to FIG. 3A, the second photoresist layer 320 may then be patterned to provide for an overhang opening 322 in the second photoresist layer 320. The overhang opening 322 is aligned with the opening 122 of the first photoresist layer 120. If the first opening 122 is already filled with the copper pillar 130 (as shown in FIG. 3A by way of example), the overhang opening 122 is also aligned with the copper pillar 130. The width of the overhang opening 322 is greater than the width of the opening 122 (which corresponds to the width of the copper pillar 130).

Figure 3B:
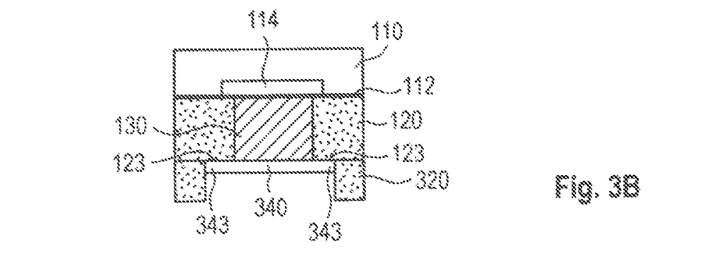

FIG. 3B illustrates forming a diffusion barrier layer 340 over the copper pillar 130 and in the overhang opening 322. The diffusion barrier layer 340 may be identical with the diffusion barrier layer 140, and reference is made to the above description in order to avoid reiteration.

However, the width of the diffusion barrier layer 340 is controlled by the patterned second photoresist layer 320 rather than by the plating process (e.g. mushroom plating). This allows to independently control the thickness and the width of the diffusion barrier layer 340. In particular, it is possible to provide for an overhang 343 of the diffusion barrier layer 340 having a lateral dimension which is significantly greater (e.g. more than 2, 3, or 4 times) than the thickness of the diffusion barrier layer 340.

Figure 3C:
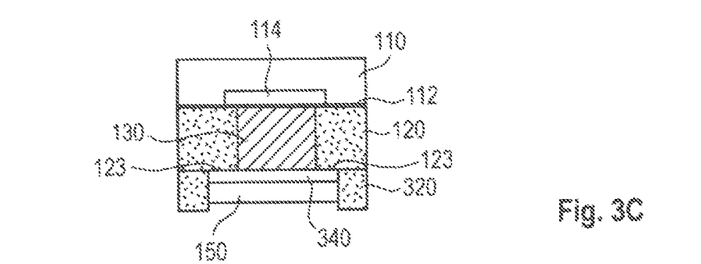

FIG. 3C illustrates depositing the solder structure 350 over the diffusion barrier layer 340. Again, reference is made to the description of FIG. 1F to avoid reiteration. However, the deposition (e.g. electroplating) of the solder structure 350 is controlled by the overhang opening 322 of the second photoresist layer 320 rather than by a plating process (e.g. mushroom plating) as mentioned in conjunction with FIG. 1F.

Figure 3D:
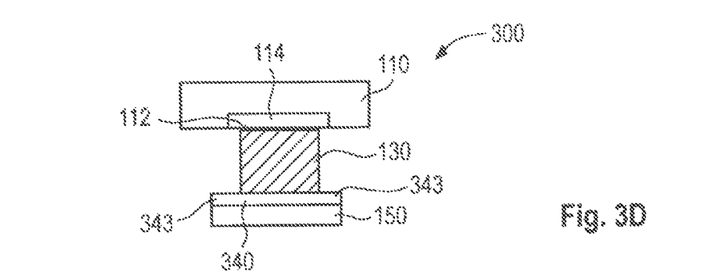
Figure 3E:
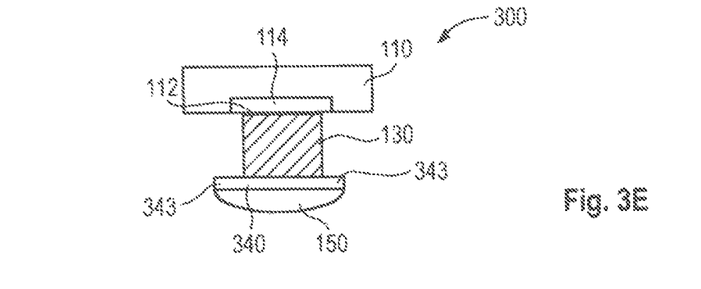

FIG. 3D-3E illustrate semiconductor devices 300 comprising a copper pillar interconnect structure before and after solder reflow, respectively. Reference is made to the description of FIGS. 1G, 1H to avoid reiteration.

Figure 4A:
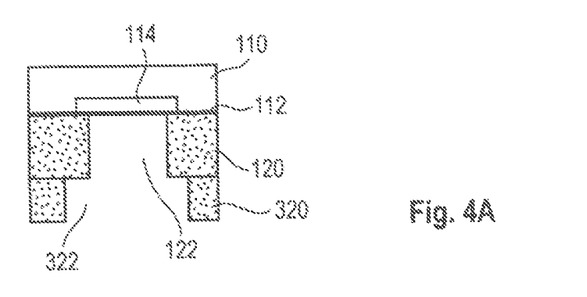
FIGS. 4A-4B are sectional views illustrating stages of an exemplary method of manufacturing a semiconductor device which could be used as an alternative to the stages of FIGS. 1D and 3A.
Figure 4B:
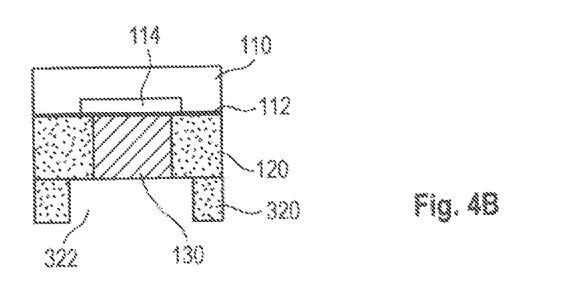

FIGS. 4A and 4B illustrate manufacturing stages which could be used alternatively to the manufacturing stages of FIGS. 1D and 3A. More specifically, FIGS. 4A and 4B illustrate that the second photoresist layer 320 is applied and patterned before the copper pillar 130 is formed in the opening 122.

Figure 5A:
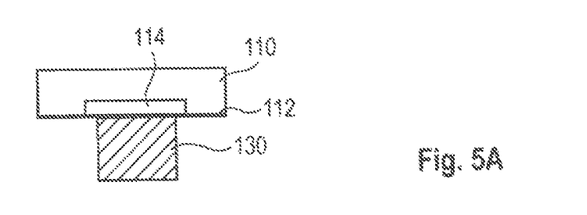
FIGS. 5A-5C are sectional views illustrating stages of an exemplary method of manufacturing a semiconductor device which could be used as an alternative to the stage of FIG. 3A.
Figure 5B:
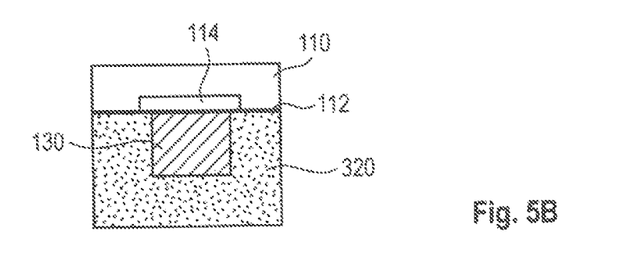
Figure 5C:
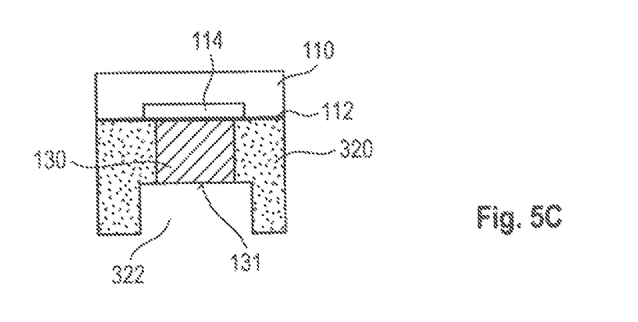

FIGS. 5A-5C illustrate another possible variation of the manufacturing process following, e.g., the manufacturing stages illustrated in FIGS. 1A-1D. Here, the photoresist layer 120 is removed after the formation of the copper pillar 130. Then, as shown in FIG. 5B, a thick second photoresist layer 320 is applied. The second photoresist layer 320 may completely cover the copper pillar 130. Then, as shown in FIG. 5C, the overhang opening 322 is formed in the second photoresist layer 320 to expose the top surface 131 of the copper pillar 130.

The processes shown in FIGS. 4A-4B and 5A-5C may then continue as illustrated by the manufacturing stages of FIGS. 3B-3E.

FIGS. 6A-6E illustrate stages of manufacturing a semiconductor device 600. The manufacturing stages illustrated in FIG. 6A-6E may be identical to the manufacturing stages shown in FIGS. 3A-3E, respectively, with the exception that the level of top surface 131 the copper pillar 130 is spaced apart from the level of the top surface 121 of the first photoresist layer 120 by dimension D1. In this context reference is made to the description in conjunction with FIGS. 2A-2D for the sake of brevity.

As a result, the semiconductor device 600 includes a copper pillar interconnect structure having a diffusion barrier layer 640 which has a first sidewall portion 645 of a base portion 640_1 of the diffusion barrier layer 640 and a second sidewall portion 646 of an overhang portion 640_2 of the diffusion barrier layer 640. The base portion 640_1 has a first width which is less than a second width of the overhang portion 640_2. The first width may be identical to the width of the copper pillar 130. That way, similar features and advantages as described in conjunction with the semiconductor device 200 (in view of the stepped diffusion barrier layer) and the semiconductor device 300 (in view of the independency of designing the width and thickness of the overhang portion 640_2 of the diffusion barrier layer 640) are obtained. Specifically, the first sidewall portion 645 and the second sidewall portion 646 may form a stepped sidewall of the diffusion barrier layer 640. Further, in contrast to the tapering shape of the overhang portion 140_2 of the diffusion barrier layers 140 (see FIGS. 2B-2D), the second width may be constant along the thickness of the overhang portion 640_2.

Figure 6A:
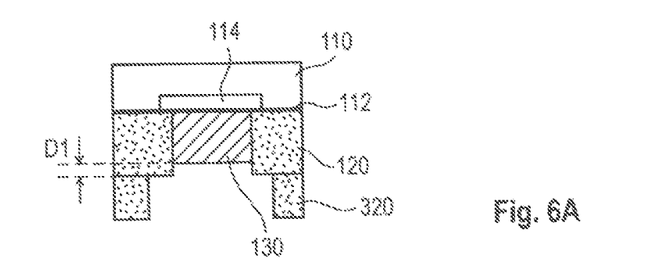
FIGS. 6A-6E are sectional views illustrating stages of an exemplary method of manufacturing a semiconductor device according to the second aspect of the disclosure, wherein a diffusion barrier layer atop a copper pillar has a stepped sidewall.
Figure 6B:
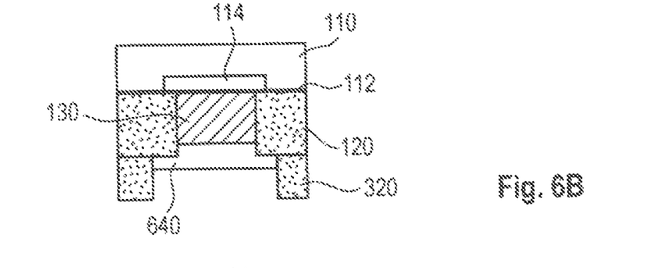
Figure 6C:
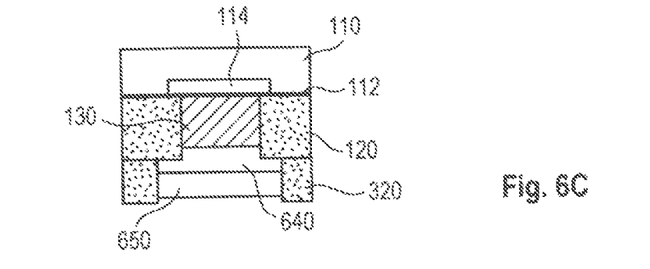
Figure 6D:
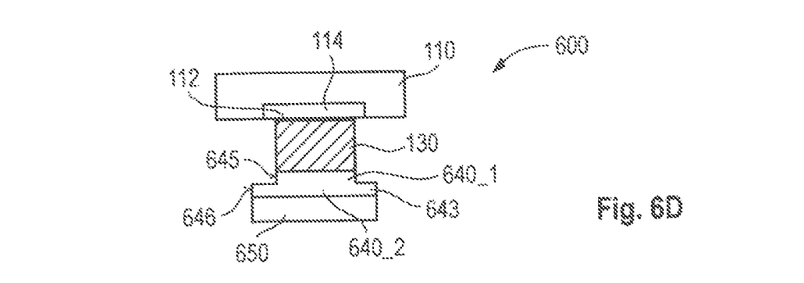
Figure 6E:
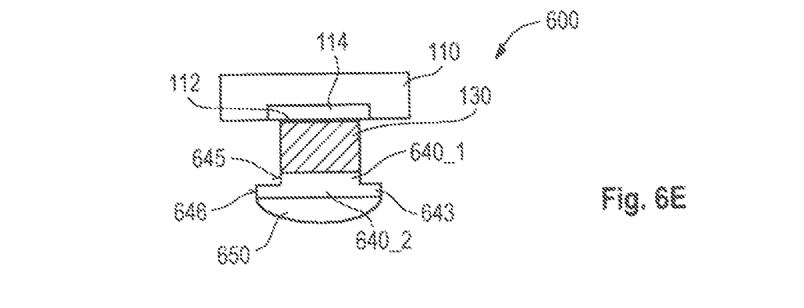

Specifically, the overhang portion 640_2 includes an overhang 643 which may be shaped as a circumferential brim of the diffusion barrier layer 640. The lateral dimension of the overhang 643 can be controlled by determining the first width and the second width. In particular, it is possible to provide for an overhang 643 of the diffusion barrier layer 640 having a lateral dimension which is significantly greater (e.g. more than 2, 3, or 4 times) than the thickness of the overhang portion 640_2 of the diffusion barrier layer 640.

Figure 7A:
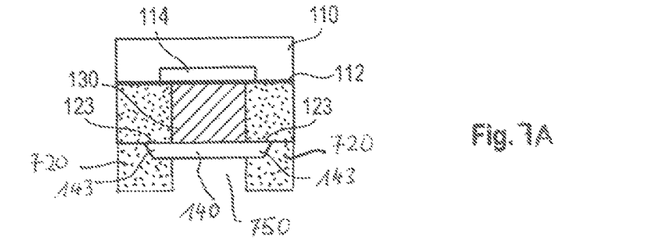
FIGS. 7A-7C are sectional views illustrating stages of an exemplary method of manufacturing a semiconductor device which could be used as an alternative to the stages of FIGS. 1F and 1G.
Figure 7B:
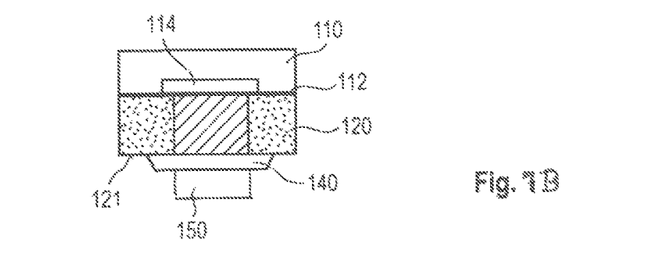
Figure 7C:
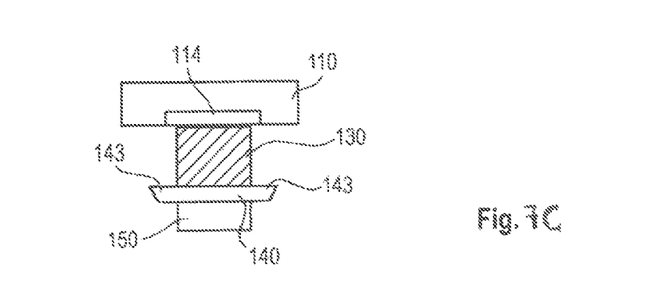

Various modifications and combinations of stages of manufacturing a semiconductor device 100, 200, 300, 400 are feasible throughout the first and second aspects of the disclosure. Referring to FIGS. 7A-7C, the process illustrated in FIGS. 1A-1H could optionally be modified by an application of a third photoresist layer 720 after the manufacturing stage shown in FIG. 1E. The third photoresist layer 720 is added atop the (first) photoresist layer 120 and atop the diffusion barrier layer 140 (see FIG. 7A).

Further to FIG. 7A, the third photoresist layer 720 may then be patterned to provide for a solder opening 750. The solder opening 750 may be designed to have any width and depth as desired to appropriately control the amount of solder deposition. The solder opening 750 may, e.g., have a width equal to the width of the copper pillar 130.

The solder opening 750 is then filled by solder material to form the solder structure 150. All solder deposition processes as described above in conjunction with the second aspect of the disclosure could be used.

Further stages of manufacturing comprise removal (stripping) of the patterned third photoresist layer (see FIG. 7B) and of the patterned (first) photoresist layer 120 (see FIG. 7C). Reference is made to the description of FIGS. 1F and 1G (which correspond to FIGS. 7B and 7C, respectively) to avoid reiteration.

Following the manufacturing stage shown in FIG. 7C, the process may continue with solder reflowing to end up with a semiconductor device 100 as illustrated in FIG. 1H.

Figure 8A:
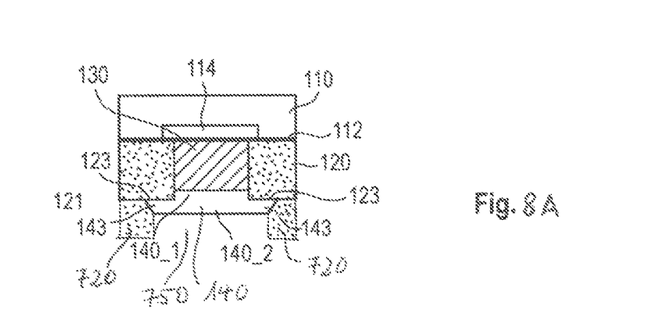
FIGS. 8A-8B are sectional views illustrating stages of an exemplary method of manufacturing a semiconductor device which could be used as an alternative to the stage of FIG. 2C.
Figure 8B:
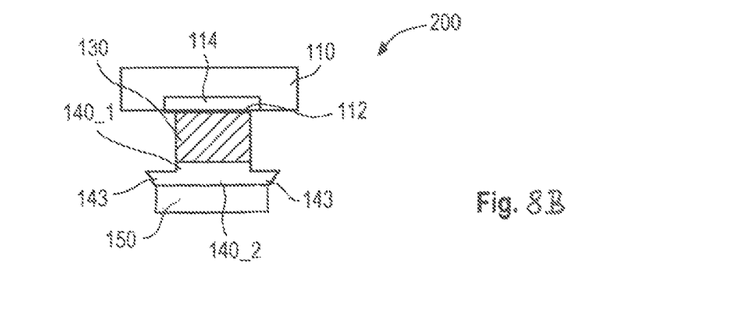

Referring to FIGS. 8A-8B, the process illustrated in FIGS. 2A-2D could optionally be modified in a similar manner as described above by application of a third photoresist layer 720. Starting at the manufacturing stage shown in FIG. 2B, the third photoresist layer 720 is added atop the (first) photoresist layer 120 and atop the diffusion barrier layer 140 (see FIG. 8A). The third photoresist layer 720 may then be patterned to provide for the solder opening 750. The solder opening 750 may be designed to have any width and depth as desired, here, e.g., a width corresponding to a flat surface portion of the diffusion barrier layer 140 (or a width equal to the width of the copper pillar 130 as described above).

The solder opening 750 is then filled by solder material to form the solder structure 150. Then, similar as described in conjunction with FIGS. 7B and 7C, the process may proceed to the stage of manufacturing shown in FIG. 8B, which corresponds to FIG. 2C. A semiconductor device 200 (see FIG. 2D) with a stepped diffusion barrier layer 140 may then be obtained by solder reflow.

The optional third photoresist layer 720 has a function similar to the function of the second photoresist layer 320 in view of solder application but does not assist diffusion barrier layer 140 formation. The third photoresist layer 720 helps to precisely control the application of the solder structure 150 and may therefore add reliability to the method of manufacturing a semiconductor device 100, 200 according to the first aspect of the disclosure.

Figure 9A:
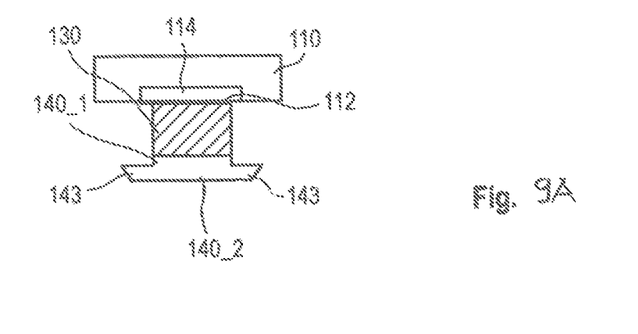
FIGS. 9A-9C are sectional views illustrating stages of an exemplary method of manufacturing a semiconductor device which could be used as an alternative to the stage of FIG. 8A.
Figure 9B:
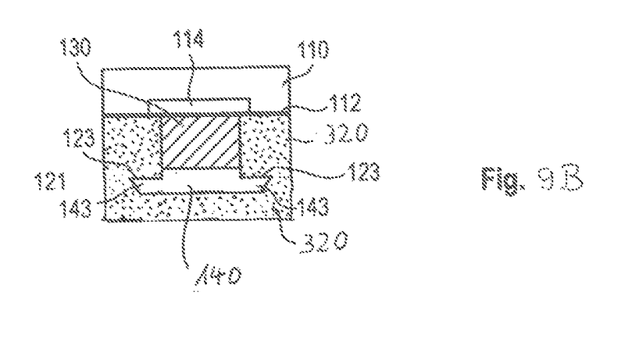
Figure 9C:
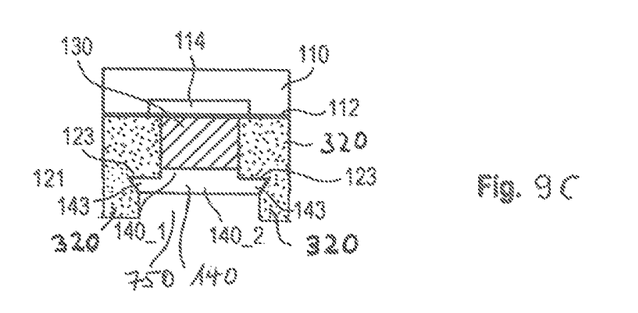

Referring to FIGS. 9A-9C, the process illustrated in FIGS. 8A-8B could optionally be modified in accordance with principles as described above with reference to FIGS. 5A-5C and 7A-7C. Specifically, starting at the manufacturing stage shown in FIG. 2B (i.e. the copper pillar 130 with a height less than the thickness of the first photoresist layer 120 and the diffusion barrier layer 140 have already been produced), the first photoresist layer 120 is removed (stripped). This may result in an exposed copper pillar interconnect structure without solder structure as shown in FIG. 9A.

Then, similar to the manufacturing stage shown in FIG. 5B, a thick second photoresist layer 320 is applied, see FIG. 9B.

Referring to FIG. 9C, the thick second photoresist layer 320 may then be patterned to provide for a solder opening 750. In view of characteristics of the solder opening 750, reference is made to the above description of FIGS. 7A-7C.

The solder opening 750 (which is here produced in the thick second photoresist layer 320 rather than in the third photoresist layer 720 as illustrated in FIG. 8A) is then filled with solder material, e.g., by electroplating, to form the solder structure 150. Reference is made to the description of FIGS. 8A-8B and 2D for subsequent manufacturing stages.

The following examples pertain to further aspects of the disclosure:

Example 1 is a method of manufacturing a semiconductor device, the method including depositing a photoresist layer over a semiconductor substrate; patterning the photoresist layer to form an opening in the photoresist layer; forming a copper pillar in the opening; forming a diffusion barrier layer over the copper pillar and over a photoresist portion of the photoresist layer directly adjoining the opening; and depositing a solder structure over the diffusion barrier layer.

In Example 2, the subject matter of Example 1 can optionally include wherein forming the diffusion barrier layer further comprises plating a base portion of the diffusion barrier layer in the opening; and plating an overhang portion of the diffusion barrier layer over the base portion and over the photoresist portion.

In Example 3, the subject matter of Example 2 can optionally include wherein the overhang portion of the diffusion barrier layer is formed by mushroom plating.

In Example 4, the subject matter of one of the preceding Examples can optionally include wherein depositing the solder structure includes depositing a third photoresist layer over the diffusion barrier layer; patterning the third photoresist layer to form a solder opening in the third photoresist layer; and depositing the solder structure in the solder opening.

Example 5 is a method of manufacturing a semiconductor device, the method including depositing a first photoresist layer over a semiconductor substrate; patterning the first photoresist layer to form an opening in the first photoresist layer; forming a copper pillar in the opening; depositing a second photoresist layer over the semiconductor substrate; patterning the second photoresist layer to form an overhang opening in the second photoresist layer, the overhang opening being aligned with the opening and having a width which is greater than a width of the opening; forming a diffusion barrier layer over the copper pillar and in the overhang opening; and depositing a solder structure over the diffusion barrier layer.

In Example 6, the subject matter of Example 5 can optionally include wherein depositing the second photoresist layer over the semiconductor substrate and patterning the second photoresist layer to form the overhang opening in the second photoresist layer is performed before forming the copper pillar in the opening.

In Example 7, the subject matter of Example 5 can optionally include depositing the second photoresist layer over the first photoresist layer, in particular after forming the copper pillar in the opening.

In Example 8, the subject matter of one of the Examples 5 to 7 can optionally include wherein forming the diffusion barrier layer further comprises plating a base portion of the diffusion barrier layer in the opening; and plating an overhang portion of the diffusion barrier layer in the overhang opening.

In Example 9, the subject matter of one of the Examples 4 to 7 can optionally include wherein depositing the solder structure comprises depositing the solder structure in the overhang opening.

Example 10 is a semiconductor device, including a semiconductor substrate; a copper pillar disposed at the semiconductor substrate; a solder structure disposed atop of the copper pillar; and a diffusion barrier layer arranged between the copper pillar and the solder structure; wherein the diffusion barrier layer overhangs the copper pillar and comprises a stepped sidewall.

In Example 11, the subject matter of Example 10 can optionally include wherein the diffusion barrier layer comprises a first sidewall portion of a base portion of the diffusion barrier layer, the base portion having a first width; and a second sidewall portion of an overhang portion of the diffusion barrier layer, the overhang portion having a second width, the second width is greater than the first width.

In Example 12, the subject matter of Example 11 can optionally include wherein the base portion directly adjoins the top of the copper pillar, and the overhang portion directly adjoins the solder structure.

In Example 13, the subject matter of Example 11 or 12 can optionally include wherein the first width substantially equals a width of the copper pillar.

In Example 14, the subject matter of Example 11 or 12 can optionally include wherein the second sidewall portion tapers towards the solder structure.

In Example 15, the subject matter of one of Examples 11 to 14 can optionally include wherein the second width is constant along the overhang portion.

In Example 16, the subject matter of one of Examples 11 to 15 can optionally include wherein the diffusion barrier layer is formed of a metal based on Ni.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of manufacturing a semiconductor device, the method comprising:
   depositing a photoresist layer over a semiconductor substrate;
   patterning the photoresist layer to form an opening in the photoresist layer;
   forming a copper pillar in the opening;
   forming a diffusion barrier layer over the copper pillar and over a photoresist portion of the photoresist layer directly adjoining the opening; and
   depositing a solder structure over the diffusion barrier layer,
   wherein forming the diffusion barrier layer comprises:
      plating a base portion of the diffusion barrier layer in the opening; and
      plating an overhang portion of the diffusion barrier layer over the base portion and over the photoresist portion.

2. The method of claim 1, wherein the overhang portion of the diffusion barrier layer is formed by mushroom plating.

3. The method of claim 1, wherein depositing the solder structure comprises:
   depositing an additional photoresist layer over the diffusion barrier layer;
   patterning the additional photoresist layer to form a solder opening in the additional photoresist layer; and
   depositing the solder structure in the solder opening.

4. A method of manufacturing a semiconductor device, the method comprising:
   depositing a first photoresist layer over a semiconductor substrate;
   patterning the first photoresist layer to form an opening in the first photoresist layer;
   forming a copper pillar in the opening;
   depositing a second photoresist layer over the semiconductor substrate;
   patterning the second photoresist layer to form an overhang opening in the second photoresist layer, the overhang opening being aligned with the opening and having a width which is greater than a width of the opening;
   forming a diffusion barrier layer over the copper pillar and in the overhang opening; and
   depositing a solder structure over the diffusion barrier layer.

5. The method of claim 4, wherein depositing the second photoresist layer over the semiconductor substrate and patterning the second photoresist layer to form the overhang opening in the second photoresist layer is performed before forming the copper pillar in the opening.

6. The method of claim 4, wherein the second photoresist layer is deposited over the first photoresist layer.

7. The method of claim 6, wherein the second photoresist layer is deposited after forming the copper pillar in the opening.

8. The method of claim 4, wherein forming the diffusion barrier layer comprises:

plating a base portion of the diffusion barrier layer in the opening; and plating an overhang portion of the diffusion barrier layer in the overhang opening.

9. The method of claim 4, wherein depositing the solder structure comprises:

depositing the solder structure in the overhang opening.

10. A method of manufacturing a semiconductor device, the method comprising:

depositing a photoresist layer over a semiconductor substrate;

patterning the photoresist layer to form an opening in the photoresist layer;

forming a copper pillar in the opening;

forming a diffusion barrier layer over the copper pillar and over a photoresist portion of the photoresist layer directly adjoining the opening; and depositing a solder structure over the diffusion barrier layer, wherein depositing the solder structure comprises:

depositing an additional photoresist layer over the diffusion barrier layer;

patterning the additional photoresist layer to form a solder opening in the additional photoresist layer; and depositing the solder structure in the solder opening.

11. A method of manufacturing a semiconductor device, the method comprising:

coating a surface of a semiconductor substrate by a seed layer, the seed layer covering a die pad exposed at the surface of the semiconductor substrate;

depositing a photoresist layer on the seed layer;

patterning the photoresist layer to form an opening in the photoresist layer, the opening exposing a part of the seed layer that covers the die pad;

forming a copper pillar in the opening;

forming a diffusion barrier layer over the copper pillar and over a photoresist portion of the photoresist layer directly adjoining the opening; and depositing a solder structure over the diffusion barrier layer, wherein the diffusion barrier layer prevents direct contact of the solder structure and the copper pillar.

12. The method of claim 11, further comprising:

after depositing the solder structure over the diffusion barrier layer, removing the photoresist layer and all of the seed layer except for a section of the seed layer that is interposed between the die pad and the copper pillar.

13. The method of claim 12, further comprising:

after the removing, reflowing the solder structure.

14. The method of claim 11, wherein forming the diffusion barrier layer comprises:

plating a base portion of the diffusion barrier layer in the opening; and plating an overhang portion of the diffusion barrier layer over the base portion and over the photoresist portion.

15. The method of claim 14, wherein the overhang portion of the diffusion barrier layer is formed by mushroom plating.

16. The method of claim 11, wherein depositing the solder structure comprises:

depositing an additional photoresist layer over the diffusion barrier layer;

patterning the additional photoresist layer to form a solder opening in the additional photoresist layer; and depositing the solder structure in the solder opening.

17. The method of claim 11, wherein copper metal of the copper pillar is deposited by electroplating on the part of the seed layer exposed by the opening in the photoresist layer.

* * * * *